United States Patent
Chang et al.

(10) Patent No.: US 8,796,110 B2
(45) Date of Patent: Aug. 5, 2014

(54) METHOD FOR HANDLING A THIN SUBSTRATE AND FOR SUBSTRATE CAPPING

(75) Inventors: Kuei-Sung Chang, Kaohsiung (TW); Yi Heng Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 525 days.

(21) Appl. No.: 13/214,917

(22) Filed: Aug. 22, 2011

(65) Prior Publication Data
US 2013/0052797 A1 Feb. 28, 2013

(51) Int. Cl.
*H01L 21/306* (2006.01)

(52) U.S. Cl.
USPC ............................................. 438/458

(58) Field of Classification Search
CPC .................. H01L 21/6835; B81C 1/00269
USPC .................................. 438/458; 257/E21.215
See application file for complete search history.

(56) References Cited

U.S. PATENT DOCUMENTS

2012/0223613 A1  9/2012 Hung et al.

OTHER PUBLICATIONS

Witvouw, A., "CMOS-MEMS Integration: Why, How and What?," ICCAS 2006, Nov. 5-9, 2006, San Jose, CA, pp. 826-827.

*Primary Examiner* — Walter H Swanson
(74) *Attorney, Agent, or Firm* — Slater and Matsil, L.L.P.

(57) ABSTRACT

An embodiment is a method for bonding. The method comprises bonding a handle substrate to a capping substrate; thinning the capping substrate; etching the capping substrate; and after the thinning and the etching the capping substrate, bonding the capping substrate to an active substrate. The handle substrate has an opening therethrough. The method also comprises removing the handle substrate from the capping substrate. The removing comprises providing an etchant through the opening to separate the handle substrate from the capping substrate. Other embodiments further include forming a bonding material on a surface of at least one of the handle substrate and the capping substrate such that the capping substrate is bonded to the handle substrate by the bonding material. The bonding material may be removed by using a dry etching to remove the handle substrate from the capping substrate.

20 Claims, 8 Drawing Sheets

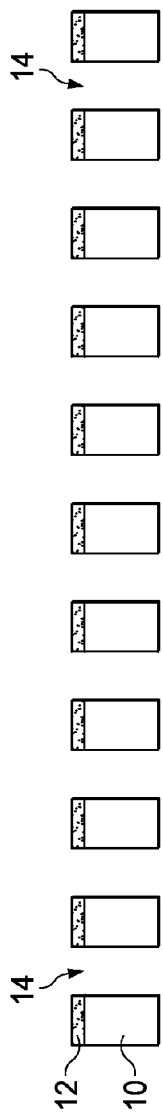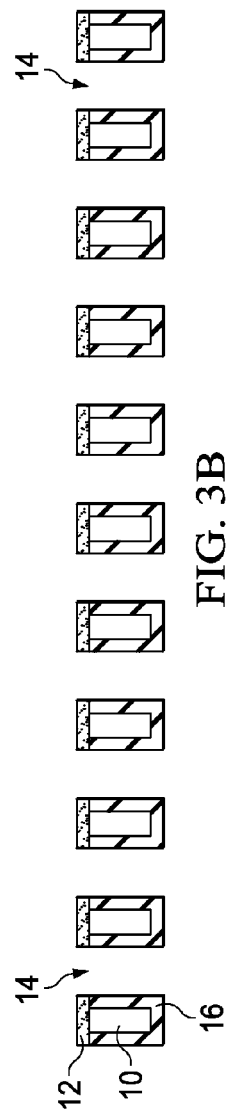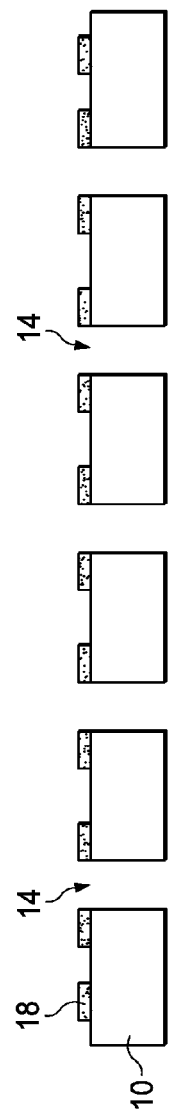
FIG. 3A
FIG. 3B
FIG. 3C

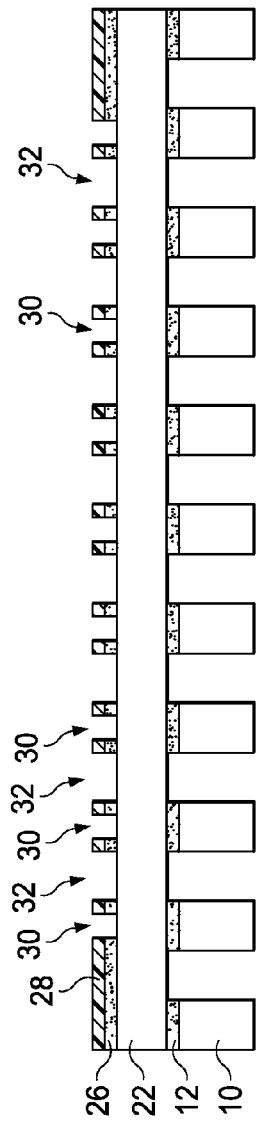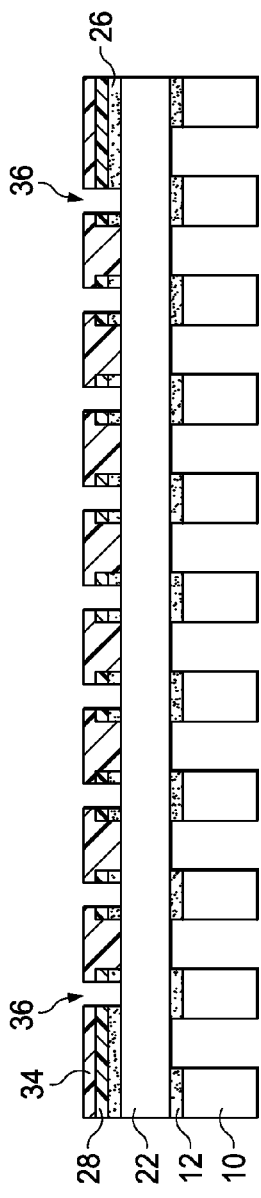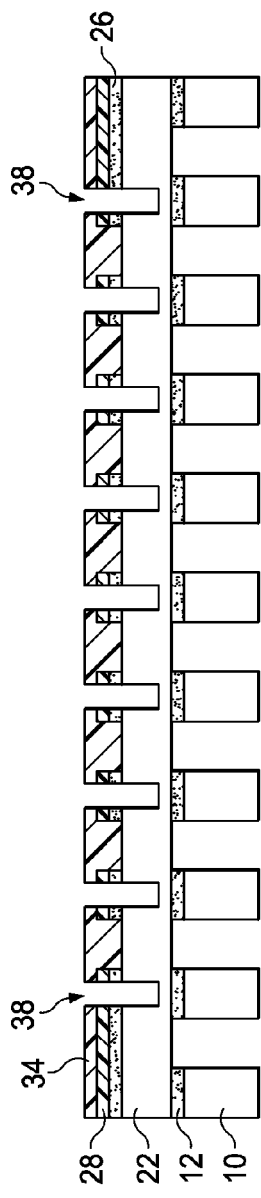

METHOD FOR HANDLING A THIN SUBSTRATE AND FOR SUBSTRATE CAPPING

BACKGROUND

Throughout the past few decades, the semiconductor industry has developed many applications for wafer bonding. Through wafer bonding, semiconductor devices may be able to achieve advantageous features that they otherwise would not be able to achieve. For example, one of these applications is in making a structure with dissimilar materials. Wafers of different materials may be bonded together to form heterojunctions, which may be useful in some semiconductor devices. Further, a thin film transferred by the bonding may have features useful for other devices, such as being stressed with a low density of defects.

Another application for wafer bonding is the bonding of a capping wafer to a device wafer, such as with micro-electromechanical systems (MEMS). In these applications, a capping wafer may hermetically seal a MEMS device to protect the device from exterior contamination and damage. Similarly, in other applications besides MEMS, a capping wafer may be used to provide protection and stability to an active device.

Typical processes for bonding a capping wafer to a device wafer have disadvantages. First, the capping wafer is usually thin, which typically requires thinning of the capping wafer. The thinning is generally performed after the capping wafer is bonded to the active wafer because a thin capping wafer is usually too thin to handle individually. This thinning, however, may introduce mechanical shock defects in a die formed by the bonding of the capping wafer and the active wafer. Further, individual dies are typically tested after bonding the capping wafer to the active wafer. This generally requires access to the individual dies, which typically cannot be achieved without dicing the capping wafer. Thus, wet dicing of the capping wafer is generally performed to allow access to individual dies. The wet dicing may cause further mechanical shock defects in resulting dies and may cause wet processing concerns, such as wet residues left on the dies.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 1 through 16 illustrate various structures through steps of a process to bond a capping substrate to an active substrate according to an embodiment.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely using a handle substrate in a process to bond a capping substrate to a device substrate. The handle substrate may be used in multiple iterations to bond other capping substrates to respective device substrates. Specific examples where an embodiment may be used is with capping micro-electro-mechanical systems (MEMS) devices, sensors, other active devices, the like, and/or a combination thereof.

FIGS. 1 through 16 illustrate various structures through steps of a process to bond a capping substrate to an active substrate according to an embodiment. Although the steps are discussed in a particular order, embodiments are not limited to such order, and embodiments contemplate performance of steps in any logical order.

Figure 1:
Figure 2:
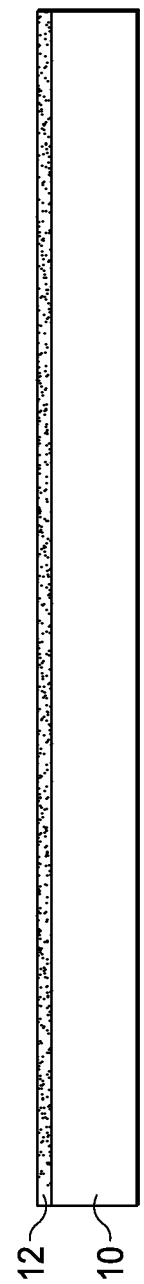

FIG. 1 shows a handle substrate 10. The handle substrate 10 is, for example, a silicon wafer. In other embodiments, the handle substrate 10 comprises silicon oxide, metal oxide, the like, and/or a combination thereof. FIG. 2 illustrates the formation of a bonding material 12, such as silicon oxide, on a top surface of the handle substrate 10. The bonding material 12 may be formed by chemical vapor deposition (CVD), atomic layer deposition (ALD), thermal treatments, sputtering, a chemical/electrochemical treatment, the like, and/or a combination thereof. In other embodiments, the bonding material 12 is any material capable of forming a bond, such as a Van der Waals, hydrogen, covalent, or other bond, with a capping substrate used later in the process. For example, the bonding material 12 may be a carbon-based material, photoresist, polymer film, the like, and/or a combination thereof. Also in some embodiments, the bonding material 12 is capable of being selectively etched to release the handle substrate 10 from the capping substrate, such as by using dilute hydrofluoric acid (HF), buffered HF, vapor HF, an oxygen plasma, or oxygen radical.

Figure 3D:
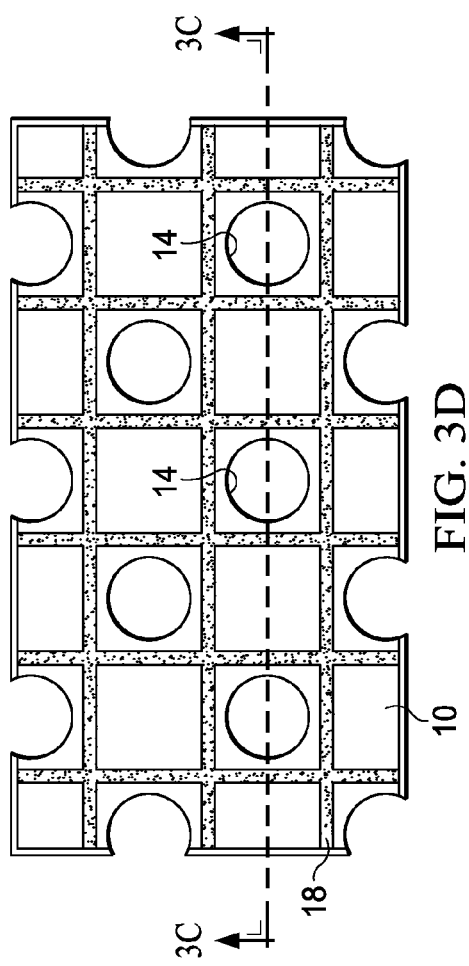

FIGS. 3A through 3D illustrate different variations of the handle substrate 10 for use in the process. FIG. 3A depicts the formation of openings 14 through the handle substrate 10 and the bonding materials 12. The openings 14 generally aid in a subsequent release step when the bonding material 12 may be selectively etched. The openings 14 may be formed by acceptable etching processes, such as by an anisotropic etch. In FIG. 3B, the handle substrate 10 may have a dielectric material 16 formed on exposed surfaces of the handle substrate 10. The dielectric material 16 in this embodiment is an oxide and is formed by thermal oxidation. Other dielectric materials may be used and formed by acceptable techniques.

FIG. 3C depicts openings 14 formed through the handle substrate 10 with the handle substrate 10 having patterned bonding material 18 on a top surface. FIG. 3D illustrates a plan view of the structure of FIG. 3C, with the cross section of FIG. 3C being taken from line 3C-3C. In this embodiment, subsequent to the formation of the bonding materials 12, the bonding materials 12 are patterned, such as by acceptable lithography steps, to form the patterned bonding material 18 having a grid pattern, as shown in FIG. 3D. Then, the openings 14 are formed through the handle substrate 10 as previously discussed. The bonding materials 12 may therefore cover an entire top surface of the handle substrate 10 or may be patterned to cover only a portion of the top surface of the handle substrate 10. Other patterns may be used, such as a polygonal grid that does not have right angles, a circular or oval pattern, other rectangular grids, the like, and/or a combination thereof.

Figure 4:
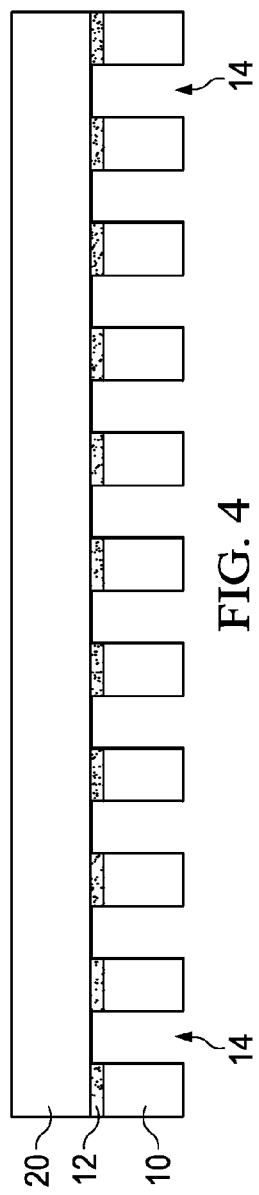

FIG. 4 shows bonding a capping substrate 20 to the handle substrate 10 using the bonding materials 12. In this embodiment, the handle substrate 10 shown in FIG. 3A is used, but in other embodiments, the structures of FIGS. 3B through 3D or other structures may be used. In this example, the capping substrate 20 is a silicon wafer, but also may comprise silicon oxide, metal oxide, the like, and/or a combination thereof. The bonding may be by using Van der Waals, hydrogen, covalent, and/or other bonds, and may be achieved using acceptable bonding techniques. For example, one or more of the bonded surfaces may be activated by a plasma and rinsed using deionized water and/or an RCA clean. The surfaces then may be brought together and annealed.

Figure 5:
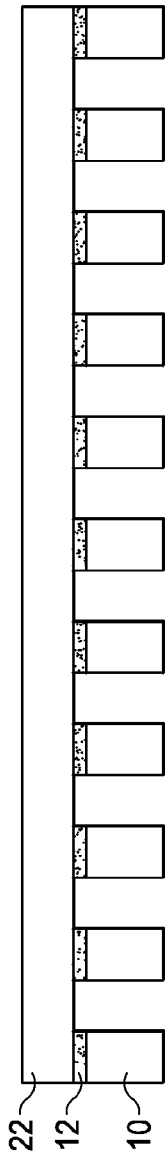

FIG. 5 illustrates a thin capping substrate 22 after the capping substrate 20 is thinned. For example, the capping substrate 20 may be thinned by grinding and/or polishing using chemical mechanical polishing (CMP), etching, using SMARTCUT, the like, and/or a combination thereof to form the thin capping substrate 22. As an example, the thinning may reduce the capping substrate 20 thickness from about 700 micrometers to the thin capping substrate 22 thickness of about 200 micrometers. It should also be noted that other embodiments contemplate the thin capping substrate 22 being bonded to the handle substrate 10 as discussed with respect to FIG. 4. In such a situation, the thin capping substrate 22 would not need to be subsequently thinned as discussed with respect to FIG. 5.

Figure 6:
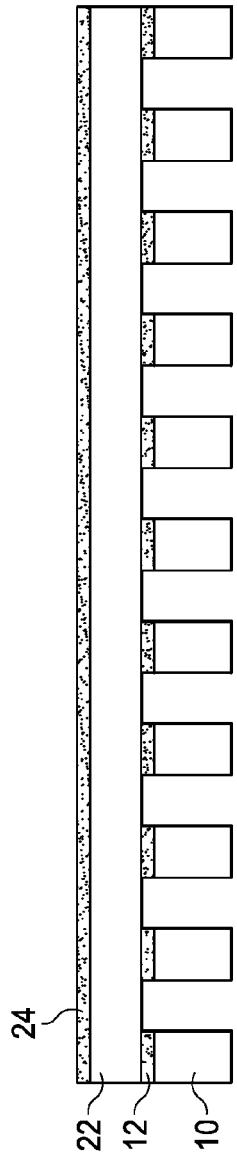

FIG. 6 shows the formation of a bonding material 24 on a top surface of the thin capping substrate 22. The top surface of the thin capping substrate 22 is opposite to the surface of the thin capping substrate 20 that is bonded to the handle substrate 10. The bonding material 24 in this example is aluminum, germanium, or gold. For example, if the bonding material 24 on the thin capping substrate 22 is aluminum, the surface of the other substrate to be bonded may include silicon, aluminum, or germanium. If the bonding material 24 is germanium, the surface of the other substrate to be bonded may include aluminum, and if the bonding material 24 is gold, the surface to be bonded may include silicon or gold. The bonding material 24 may be formed using physical vapor deposition (PVD), such as sputtering or evaporation, the like, and/or a combination thereof. Further, low temperature direct bonding techniques are known in the art, and thus, the formation of the bonding material 24 may be omitted. Such modifications would be readily apparent to a person having ordinary skill in the art and thus are omitted for brevity.

Figure 7:
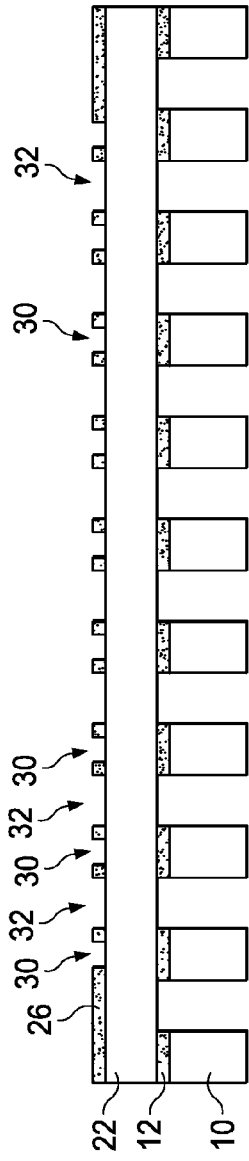

FIG. 7 depicts the patterning of the bonding material 24 to form patterned bonding material 26. The patterning may be performed using acceptable lithography techniques. The patterned bonding material 26 has first openings 30 to expose a dicing line area of the thin capping substrate 22 and second openings 32 to expose a cavity area of the thin capping substrate 22. FIG. 8 illustrates the formation and patterning of a first protective film 28 over the patterned bonding material 26. The first protective film 28 in this example is silicon oxide, although other materials, such as silicon nitride, silicon oxynitride, the like, and/or a combination thereof, may be used. The first protective film 28 may be deposited using CVD, ALD, PVD, the like, and/or a combination thereof, and may be patterned using acceptable lithography techniques. The first protective film 28 is patterned to have openings corresponding to the first openings 30 and the second openings 32 of the patterned bonding material 26. It should be noted that while the figures depict the formation and patterning of each of the patterned bonding material 26 and the first protective film 28 separately, the bonding material 24 and the first protective film 28 may be formed and then patterned in a same process step to form the patterned bonding material 26 and the first protective film 28.

FIG. 9 shows the formation and patterning of a second protective film 34. In this embodiment, the second protective film 34 is a photoresist and is patterned using exposure to light. Other embodiments contemplate other materials, such as a hardmask of silicon nitride, patterned using acceptable lithography techniques. It is worth noting that various materials for the first protective film 28 and the second protective film 35 may be used as long as the films may be selectively removed and provide proper protection during etching. The second protective film 34 is patterned to have openings 36 corresponding to the first openings 30 to expose the dicing line area of the thin capping substrate 22. The second protective film 34 covers the second openings 32.

Figure 11:
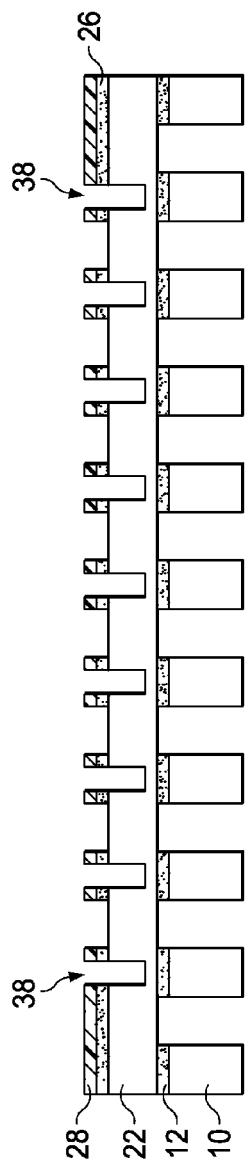
Figure 12:
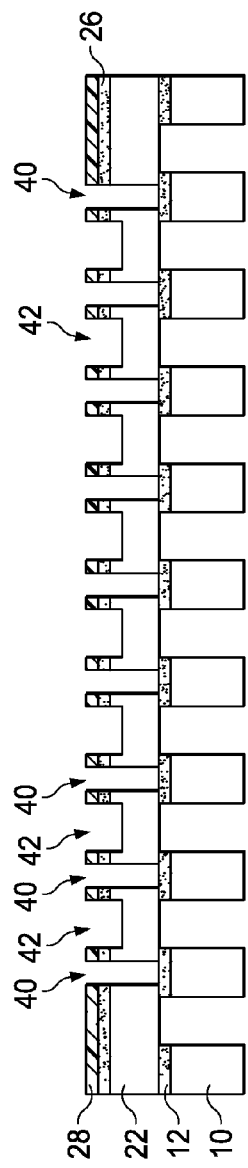
Figure 13:
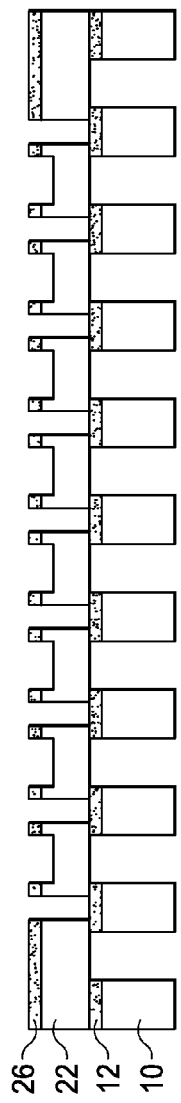

FIG. 10 illustrates a first etching of the thin capping substrate 22 in the dicing line area. The etching in this example etches a recess 38 to a depth of the thin capping substrate 22 that is less than the thickness of the capping substrate 22. In FIG. 11, the second protective film 34 is removed, for example, by an ash and/or flush process. This removal exposes the cavity area of the thin capping substrate 22 by the second openings 32. In FIG. 12, a second etch is performed to etch the dicing line area through the remaining thickness of the thin capping substrate 22 to form openings 40 and to etch a depression in the thin capping substrate 22 to form cavities 42. The formation of openings 40 may be a die-to-die separation of the capping substrate performed before bonding the capping substrate to an active substrate. FIG. 13 shows the removal of the first protective film 28, such as by an etch selective to the material of the first protective film 28.

Figure 14:
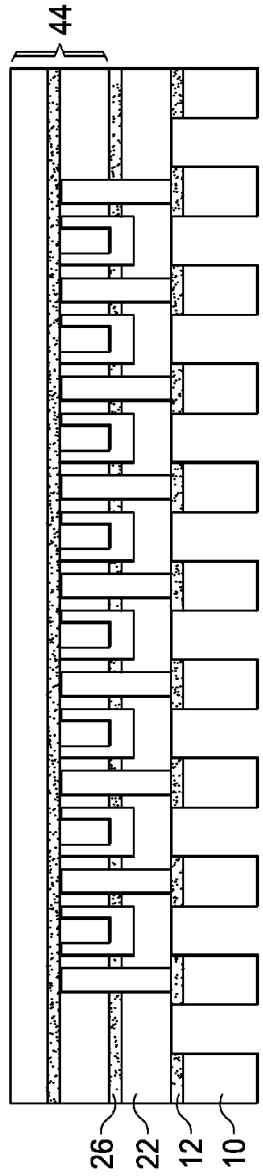

FIG. 14 shows bonding of the thin capping substrate 22 to an active substrate 44 using the patterned bonding material 26. The active substrate 44 includes dies with each die comprising an active device to be capped that corresponds in location to the cavities 42 of the thin capping substrate 22. Further, the active substrate 44 includes dicing openings between individual dies that correspond to the openings 40 of the thin capping substrate 22. The bonding may be performed using an acceptable bonding technique. For example, as previously discussed, if the patterned bonding material 26 on the thin capping substrate 22 is aluminum, the surface of the active substrate 44 to be bonded may include silicon, aluminum, or germanium. If the patterned bonding material 26 is germanium, the surface of the active substrate 44 to be bonded may include aluminum, and if the patterned bonding material 26 is gold, the surface of the active substrate 44 to be bonded may include silicon or gold. Although materials are discussed as being on a particular surface, the materials may be on different surfaces to be bonded. The surfaces may then be brought together and subsequently annealed to form the bond. In other techniques, other materials may be used as a bonding material, or no bonding material may be used at all. One or more of the surfaces may be activated by, for example, a plasma, and/or cleaned, for example, by an RCA clean. The surfaces then may be brought together for bonding, and in some situations, an anneal may be performed. Many different techniques are known in the art, and a person having ordinary skill in the art will readily understand the applicability and/or modifications for these techniques. Thus, the bonding may form Van der Waals, hydrogen, covalent, fused, and/or other bonds.

Figure 15:
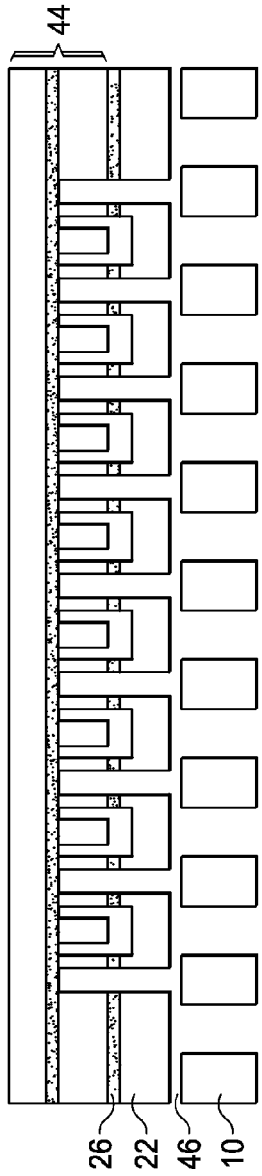

FIG. 15 illustrates releasing the handle substrate 10 from the bonded structure that comprises the thin capping substrate 22 and the active substrate 44. To release the handle substrate 10, the bonding material 12 is selectively removed. Released space 46 is notated to identify a space where the bonding materials 12 were located before removal. The bonding materials 12 in this embodiment are removed by causing a chemical reaction with the bonding materials, such as by using a dry etching process that provides an etchant, through the openings 14 to selectively remove the bonding materials 12. For example, if the bonding materials 12 are silicon oxide, a vapor hydrofluoric acid (HF) may be used to remove the silicon oxide. Other removal techniques may use an oxygen plasma or oxygen radical, such as when the bonding materials 12 are a carbon-based material. Still other techniques to selectively remove the bonding materials are known and are contemplated by embodiments.

Figure 16:
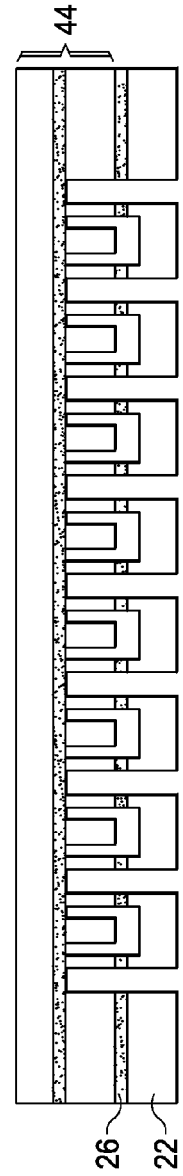

FIG. 16 shows the bonded structure comprising devices that are capped using the thin capping substrate 22. The bonded structure then may be packaged according to acceptable packaging techniques, such as wafer level packaging. Wafer level packaging generally includes encapsulating the individual capped dies with a molding compound, such as by compression molding with a plastic molding. The individual capped dies then are diced along the dice line areas and attached to another substrate, such as a ceramic substrate. It is worth noting that embodiments contemplate various packaging styles, which may depend on the specific configuration of the dies of the active substrate 44.

The handle substrate 10 is removed from and is not a part of the bonded structure. After removal, the handle substrate 10 may have bonding materials 12 formed on a surface again, such as shown in FIGS. 3A through 3D, and may be used in a subsequent iteration of the process, for example, shown in FIGS. 4 through 16 using another thin capping substrate 22 and active substrate 44.

Figure 17:
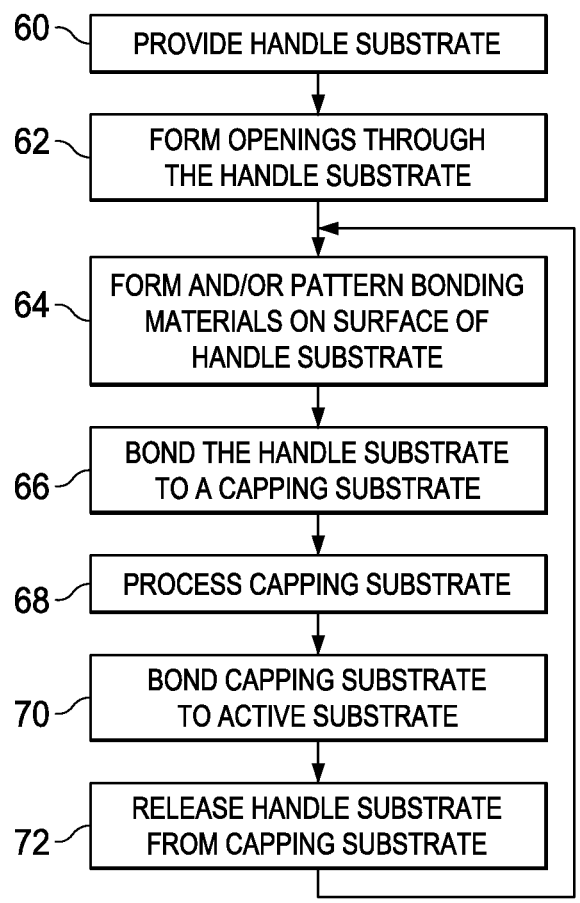
FIG. 17 is a flowchart of an example process according to an embodiment.

FIG. 17 is a flowchart of an example process. In step 60, a handle substrate is provided. In step 62, openings are formed through the handle substrate, such as by etching. In step 64, bonding materials are formed and/or patterned on a surface of the handle substrate. In step 66, the handle substrate is bonded to a capping substrate using the bonding materials formed in step 64. In step 68, the capping substrate is processed, such as by thinning and/or etching recesses and/or openings. In step 70, the capping substrate is bonded to an active substrate to, for example, cap devices on the active substrate. In step 72, the handle substrate is released from the capping substrate, for example, by removing the bonding materials formed in step 64. From step 72, the process steps starting at step 64 may be repeated. Further details of this example process are provided above and the process may be read in conjunction with that discussed in FIGS. 1 through 16. Also, steps shown in FIG. 17 may be performed in other logical orders, such as, different orders between subsequent iterations of the process. For example, step 64 may be performed before step 62 in a first iteration, but step 62 may be omitted in subsequent iterations.

By using an embodiment, disadvantages of the prior art may be obviated. In an embodiment, a capping substrate may be processed before it is bonded to an active substrate. For example, the capping substrate may be thinned, and dicing lines in the capping substrate may be etched before the capping substrate is bonded to the active substrate. By thinning the capping substrate and etching the dicing lines, mechanical shock in a subsequently bonded structure may be avoided and individual dies still may be accessed for testing. Further, wet processing, such as a wet dicing of a capping substrate after bonding, may be avoided in the bonded structure. This may avoid wet processing induced defects in the bonded structure. It is also worth noting that wet processes may be used before bonding and that wet processes may be acceptable after bonding, particularly if the process is well tuned. Further advantages are also attainable, such as retrieving and reusing a handle wafer and providing a robust, easily compatible, and cheap process for capping.

An embodiment is a method for bonding. The method comprises bonding a handle substrate to a capping substrate; thinning the capping substrate; etching the capping substrate; and after the thinning and the etching the capping substrate, bonding the capping substrate to an active substrate. The handle substrate has an opening therethrough. The method also comprises removing the handle substrate from the capping substrate. The removing comprises providing an etchant through the opening to separate the handle substrate from the capping substrate.

A further embodiment is a method for bonding. The method comprises providing a handle substrate having a first surface and a second surface opposite to the first surface; forming a bonding material on the first surface of the handle substrate; and forming an opening through the handle substrate. The opening extends from the first surface of the handle substrate to the second surface of the handle substrate. The method also comprises bonding a first surface of a capping substrate to the bonding material on the first surface of the handle substrate, and processing a second surface of the capping substrate while the first surface of the capping substrate is bonded to the bonding material. The processing includes etching and thinning. The method further comprises bonding a second surface of the capping substrate to an active substrate, and removing the bonding material by using, at least partially, the opening.

Another embodiment is a method for bonding. The method comprises bonding a handle substrate to a surface of a capping substrate using a bonding material. The handle substrate has openings extending from a first surface of the handle substrate to a second surface of the handle substrate. The method also comprises thinning the capping substrate on a surface of the capping substrate opposite to the surface of the capping substrate bonded to the handle substrate thereby forming a thinned surface of the capping substrate, and etching a dicing line through the thinned surface of the capping substrate. After the thinning the capping substrate and the etching the dicing line, the method comprises bonding the thinned surface of the capping substrate to an active substrate, and after the bonding the thinned surface to the active substrate, providing a substance through the openings to cause a chemical reaction with the bonding material. The chemical reaction removes the bonding material.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for bonding, the method comprising:
bonding a handle substrate to a capping substrate, the handle substrate having an opening therethrough;
thinning the capping substrate;
etching the capping substrate;
after the thinning and the etching the capping substrate, bonding the capping substrate to an active substrate; and removing the handle substrate from the capping substrate, the removing comprising providing an etchant through the opening to separate the handle substrate from the capping substrate.

2. The method of claim 1, wherein the bonding the handle substrate to the capping substrate comprises forming a bonding material on a surface of at least one of the handle substrate and the capping substrate, the capping substrate being bonded to the handle substrate by the bonding material.

3. The method of claim 2, wherein the removing the handle substrate from the capping substrate comprises etching the bonding material.

4. The method of claim 3, wherein the etching the bonding material is a dry etching.

5. The method of claim 2, wherein the removing the handle substrate from the capping substrate comprises removing the bonding material through the opening.

6. The method of claim 1, wherein the thinning the capping substrate is performed while the capping substrate is bonded to the handle substrate.

7. The method of claim 1, wherein the etching the capping substrate comprises etching a recess in a dicing line area into the capping substrate while the capping substrate is bonded to the handle substrate.

8. The method of claim 1, the etching the capping substrate comprising forming cavities in the capping substrate, each of the cavities in the capping substrate capping a corresponding active device in the active substrate.

9. The method of claim 1 further comprising:
after the removing the handle substrate, bonding the handle substrate to an additional capping substrate;
bonding the additional capping substrate to an additional active substrate; and
removing the handle substrate from the additional capping substrate.

10. A method for bonding, the method comprising:
providing a handle substrate having a first surface and a second surface opposite to the first surface;
forming a bonding material on the first surface of the handle substrate;
forming an opening through the handle substrate, the opening extending from the first surface of the handle substrate to the second surface of the handle substrate;
bonding a first surface of a capping substrate to the bonding material on the first surface of the handle substrate;
processing a second surface of the capping substrate while the first surface of the capping substrate is bonded to the bonding material, the processing including etching and thinning;
bonding a second surface of the capping substrate to an active substrate; and
removing the bonding material by using, at least partially, the opening.

11. The method of claim 10, wherein the processing the second surface of the capping substrate comprises etching a recess in a dicing line area from the second surface of the capping substrate into the capping substrate.

12. The method of claim 10, wherein the processing the second surface of the capping substrate comprises etching cavities in the capping substrate, each of the cavities capping a corresponding active device in the active substrate.

13. The method of claim 10, wherein the removing the bonding material comprises using a dry etching process.

14. The method of claim 10, wherein the forming the bonding material comprises patterning the bonding material to expose a portion of the first surface of the handle substrate.

15. The method of claim 10 further comprising:
after the removing the bonding material, forming an additional bonding material on the first surface of the handle substrate;
bonding a first surface of an additional capping substrate to the additional bonding material on the first surface of the handle substrate;
bonding a second surface of the additional capping substrate to a first surface of an additional active substrate; and
removing the additional bonding material by using, at least partially, the opening.

16. A method for bonding, the method comprising:
bonding a handle substrate to a surface of a capping substrate using a bonding material, the handle substrate having openings extending from a first surface of the handle substrate to a second surface of the handle substrate;
thinning the capping substrate on a surface of the capping substrate opposite to the surface of the capping substrate bonded to the handle substrate thereby forming a thinned surface of the capping substrate;
etching a dicing line through the thinned surface of the capping substrate;
after the thinning the capping substrate and the etching the dicing line, bonding the thinned surface of the capping substrate to an active substrate; and
after the bonding the thinned surface to the active substrate, providing a substance through the openings to cause a chemical reaction with the bonding material, the chemical reaction removing the bonding material.

17. The method of claim 16 further comprising forming the bonding material on the handle substrate.

18. The method of claim 17 further comprising patterning the bonding material on the handle substrate, wherein the bonding material does not cover an entirety of the first surface of the handle substrate.

19. The method of claim 16, wherein the providing the substance through the openings includes using a dry etch.

20. The method of claim 16 further comprising:
after the providing the substance through the openings, bonding the first surface of the handle substrate to a first surface of an additional capping substrate, the first surface of the handle substrate including an additional bonding material;
thinning the additional capping substrate; and
after the thinning the additional capping substrate, bonding the additional capping substrate to an additional active substrate.

* * * * *